US008981233B2

(12) United States Patent
Sakurai et al.

(10) Patent No.: US 8,981,233 B2
(45) Date of Patent: Mar. 17, 2015

(54) CONDUCTIVE MEMBER AND METHOD FOR PRODUCING THE SAME

(71) Applicant: Mitsubishi Shindoh Co., Ltd., Tokyo (JP)

(72) Inventors: Takeshi Sakurai, Aizuwakamatsu (JP); Seiichi Ishikawa, Aizuwakamatsu (JP); Kenji Kubota, Aizuwakamatsu (JP); Takashi Tamagawa, Aizuwakamatsu (JP)

(73) Assignee: Mitsubishi Shindoh Co., Ltd., Tokyo (JP)

( * ) Notice: Subject to any disclaimer, the term of this patent is extended or adjusted under 35 U.S.C. 154(b) by 0 days.

(21) Appl. No.: 14/162,008

(22) Filed: Jan. 23, 2014

(65) Prior Publication Data

US 2014/0134457 A1 May 15, 2014

Related U.S. Application Data

(62) Division of application No. 12/998,700, filed as application No. PCT/JP2009/003219 on Jul. 9, 2009, now Pat. No. 8,698,002.

(30) Foreign Application Priority Data

Jan. 20, 2009 (JP) ................................ 2009-009752
Feb. 23, 2009 (JP) ................................ 2009-039303

(51) Int. Cl.
*H05K 1/03* (2006.01)
*B32B 15/01* (2006.01)
(Continued)

(52) U.S. Cl.
CPC *C25D 5/505* (2013.01); *C25D 5/12* (2013.01); *C25D 5/50* (2013.01); *C25D 7/00* (2013.01); *H01R 13/03* (2013.01)
USPC ............. 174/255; 29/829; 428/646; 205/226

(58) Field of Classification Search
CPC ............ C25D 5/12; C25D 5/50; C25D 5/505; C25D 7/00; H01R 13/03
USPC ........................... 174/255; 428/646; 205/226
See application file for complete search history.

(56) References Cited

U.S. PATENT DOCUMENTS 4,441,118 A * 4/1984 Fister et al. .................. 257/677
2003/0091855 A1* 5/2003 Tanaka et al. ................ 428/647
(Continued)

FOREIGN PATENT DOCUMENTS

JP 2000-054189 A 2/2000
JP 2000-260230 A 9/2000
(Continued)

OTHER PUBLICATIONS

International Search Report dated Sep. 8, 2009, issued for PCT/JP2009/003219 and the English translation thereof.
(Continued)

*Primary Examiner* — Timothy Thompson
*Assistant Examiner* — Rhadames J Alonzo Miller
(74) *Attorney, Agent, or Firm* — Locke Lord LLP

(57) ABSTRACT

A method for producing a Cu—Sn layer and an Sn-based surface layer are formed in this order on the surface of a Cu-based substrate through an Ni-based base layer, and the Cu—Sn layer is composed of a $Cu_3Sn$ layer arranged on the Ni-based base layer and a $Cu_6Sn_5$ layer arranged on the $Cu_3Sn$ layer; the Cu—Sn layer obtained by bonding the $Cu_3Sn$ layer and the $Cu_6Sn_5$ layer is provided with recessed and projected portions on the surface which is in contact with the Sn-based surface layer; thicknesses of the recessed portions are set to 0.05 μm to 1.5 μm, the area coverage of the $Cu_3Sn$ layer with respect to the Ni-based base layer is 60% or higher, and the ratio of the thicknesses of the projected portions to the thicknesses of the recessed portions in the Cu—Sn layer is 1.2 to 5.

4 Claims, 3 Drawing Sheets

(51) Int. Cl.

| | |
|---|---|
| ***C25D 5/50*** | (2006.01) |
| ***C25D 5/12*** | (2006.01) |
| ***C25D 7/00*** | (2006.01) |
| ***H01R 13/03*** | (2006.01) |
| *H05K 3/00* | (2006.01) |

(56) References Cited

U.S. PATENT DOCUMENTS

| | | | | |
|---|---|---|---|---|
| 2003/0129441 | A1 * | 7/2003 | Hara et al. | 428/647 |
| 2003/0186597 | A1 * | 10/2003 | Suzuki et al. | 439/886 |
| 2005/0048308 | A1 * | 3/2005 | Mucklich et al. | 428/614 |
| 2008/0090096 | A1 * | 4/2008 | Suzuki et al. | 428/674 |
| 2009/0053553 | A1 * | 2/2009 | Masago et al. | 428/647 |
| 2009/0061253 | A1 * | 3/2009 | Yoshida et al. | 428/632 |
| 2010/0304177 | A1 | 12/2010 | Yoshida et al. | |

FOREIGN PATENT DOCUMENTS

| | | | |
|---|---|---|---|
| JP | 2003-171790 | A | 6/2003 |
| JP | 3880877 | B2 | 10/2003 |
| JP | 2004-068026 | A | 3/2004 |
| JP | 2005-344188 | A | 12/2005 |
| JP | 4090488 | B2 | 1/2007 |
| JP | 2007-247060 | A | 9/2007 |
| JP | 2007-258156 | A | 10/2007 |
| JP | 2007-277715 | A | 10/2007 |
| JP | 2009-007668 | A | 1/2009 |

OTHER PUBLICATIONS

Written Opinion of the International Searching Authority and the English translation of Box V thereof.

* cited by examiner

CONDUCTIVE MEMBER AND METHOD FOR PRODUCING THE SAME

This application is a divisional application of U.S. application Ser. No. 12/998,700, filed May 20, 2011 which claims the right of priority under 35 U.S.C. §119 based on Japanese Patent Application Nos. 2009-009752 and 2009-039303 filed Jan. 20, 2009 and Feb. 23, 2009, respectively.

TECHNICAL FIELD

The present invention relates to a conductive member that is used for a connector for electrical connection or the like and has a plurality of plated layers formed at the surface of a substrate composed of Cu or a Cu alloy, and a method for producing the same.

The present application claims priority based on Japanese Patent Application No. 2009-9752 filed in the Japanese Patent Office on Jan. 20, 2009 and Japanese Patent Application No. 2009-39303 filed in the Japanese Patent Office on Feb. 23, 2009, and the contents thereof are incorporated herein by reference.

BACKGROUND ART

As a conductive member used for a connector for electrical connection of automobiles, a connection terminal of printer substrates, or the like, plating an Sn-based metal on the surface of a Cu-based substrate composed of Cu or a Cu alloy is widely applied for improvement in electrical connection characteristics or the like.

Examples of such a conductive member include members described in PTLs 1 to 4. The conductive members described in PTLs 1 to 3 have a configuration having a Cu—Sn intermetallic compound layer (for example, $Cu_6Sn_5$) formed between an Ni layer and an Sn layer, which is obtained by sequentially plating Ni, Cu, and Sn on the surface of a substrate composed of Cu or a Cu alloy so as to form a three-layer plated layer, and then performing heating and a reflow treatment on the three-layer plated layer so as to form an Sn layer on the outermost surface layer. In addition, the member described in PTL 4 is produced by a technique in which the base plated layer is composed of, for example, Ni—Fe, Fe, or the like, and Cu and Sn are sequentially plated thereon.

CITATION LIST

[PTL 1] Japanese Patent No. 3880877

[PTL 2] Japanese Patent No. 4090488

[PTL 3] Japanese Unexamined Patent Application Publication No. 2004-68026

[PTL 4] Japanese Unexamined Patent Application Publication No. 2003-171790

SUMMARY OF INVENTION

Technical Problem

Meanwhile, when such a connector or a terminal is used in a high-temperature environment, for example, about 150° C., such as around the engine of an automobile, prolonged exposure to such a high temperature leads to mutual thermal diffusion of Sn and Cu so that there is a tendency for the surface state to easily change over time and for the contact resistance to be increased. In addition, the diffusion of Cu on the surface of the Cu-based substrate generates Kirkendall voids and thus may cause separation, and there is demand to solve such problems.

On the other hand, with regard to the member described in PTL 4, there is a problem in that adhesiveness between the base plated layer of Fe—Ni or Fe, and Cu is poor and thus the base plated layer and Cu are liable to be separated.

In addition, when used for a connector, since multipolarization of connectors according to the high integration of circuits increases an inserting force during assembly of automobile wires, there is demand for a conductive member capable of decreasing the inserting and drawing force.

The invention has been made in consideration of the above circumstances, and provides a conductive member which has a stable contact resistance, is difficult to be separated, and is also capable of decreasing and stabilizing the inserting and drawing force when used for a connector, and a method for producing the same.

Solution to Problem

The inventors of the invention analyzed the plated surfaces in the related art to solve such problems and confirmed that the cross-section of plating materials in the related art is composed of a base copper alloy and a three-layer structure of an Ni layer, a $Cu_6Sn_5$ layer, and an Sn-based surface layer, but a $Cu_3Sn$ layer is present only at an extremely small portion on the Ni layer. In addition, the inventors found that the presence of the $Cu_6Sn_5$ layer and the $Cu_3Sn$ layer mixed in a predetermined state on the Ni layer affects the generation of contact resistance and Kirkendall voids at a high temperature and the inserting and drawing force during use in a connector.

That is, the conductive member of the invention is characterized in that a Cu—Sn intermetallic compound layer and an Sn-based surface layer are formed in this order on the surface of a Cu-based substrate through an Ni-based base layer; the Cu—Sn intermetallic compound layer is composed of a $Cu_3Sn$ layer arranged on the Ni-based base layer and a $Cu_6Sn_5$ layer arranged on the $Cu_3Sn$ layer; and the Cu—Sn intermetallic compound layer obtained by bonding the $Cu_3Sn$ layer and the $Cu_6Sn_5$ layer is provided with recessed and projected portions on the surface which is in contact with the Sn-based surface layer; thicknesses of the recessed portions are set to 0.05 μm to 1.5 μm; the area coverage of the $Cu_3Sn$ layer with respect to the Ni-based base layer is 60% or higher; the ratio of the thicknesses of the projected portions to the thicknesses of the recessed portions in the Cu—Sn intermetallic compound layer is 1.2 to 5; and the average thickness of the $Cu_3Sn$ layer is 0.01 μm to 0.5 μm.

In the conductive member, the Cu—Sn intermetallic compound layer between the Ni-based base layer and the Sn-based surface layer is composed of a two-layer structure of the $Cu_3Sn$ layer and the $Cu_6Sn_5$ layer, and the $Cu_3Sn$ layer, the bottom layer of the structure, covers the Ni-based base layer, and the $Cu_6Sn_5$ layer is present so as to cover the $Cu_3Sn$ layer from the top. The Cu—Sn intermetallic compound layer obtained by bonding the $Cu_3Sn$ alloy layer and the $Cu_6Sn_5$ layer does not necessarily have a uniform film thickness and instead has recessed and projected portions, however it is important that the thicknesses of the recessed portions are 0.05 μm to 1.5 μm. If the thicknesses are smaller than 0.05 μm, Sn diffuses into the Ni-based base layer from the recessed portions at a high temperature, which may lead to a concern that deficits may be generated in the Ni-based base layer, and the deficits make Cu in the substrate diffuse and thus make the $Cu_6Sn_5$ layer reach the surface, which forms Cu oxides on the surface and thus increases the contact resistance. In addition, at this time, the diffusion of Cu from the deficit portions in the Ni-based base layer is liable to cause Kirkendall voids. On the other hand, if the thicknesses of the recessed portions exceed 1.5 μm, the Cu—Sn alloy layer becomes brittle, and thus plated films become liable to be separated during a bending process. Therefore, the thicknesses of the recessed portions in the Cu—Sn intermetallic compound layer are desirably 0.05 μm to 1.5 μm.

In addition, by arranging the Cu—Sn intermetallic compound layer with such predetermined thicknesses on the bottom layer of the Sn-based surface layer, it is possible to harden a soft Sn base and thus to achieve reduction of the inserting and drawing force and suppression of variations in the inserting and drawing force when used for a multipolar connector or the like.

In addition, the reason why the area coverage of the $Cu_3Sn$ layer with respect to the Ni-based base layer is set to 60% or higher is that, if the area coverage is low, Ni atoms in the Ni-based base layer diffuse into the $Cu_3Sn$ layer from uncovered portions at a high temperature, which causes deficits in the Ni-based base layer, and diffusion of Cu in the substrate from the deficit portions results in an increase in the contact resistance or generation of Kirkendall voids, similarly to the above case. In order to prevent an increase in the contact resistance or generation of Kirkendall voids at a high temperature, and thus realize a heat resistance equal to or higher than that in the related art, it is necessary to cover at least 60% or more of the Ni-based base layer, and, furthermore, it is desirable to set the area coverage to 80% or higher.

In addition, if the ratio of the thicknesses of the projected portions to the thicknesses of the recessed portions in the Cu—Sn intermetallic compound layer becomes small, it is preferable due to a decrease of the inserting and drawing force at the time of using a connector, but if it is smaller than 1.2, the recessed and projected portions in the Cu—Sn intermetallic compound layer decrease and, eventually, almost disappear, and thus the Cu—Sn intermetallic compound layer becomes remarkably brittle, and thus the films are easily separated during a bending process, which is not preferable. In addition, if the ratio exceeds 5, and thus the recessed and projected portions in the Cu—Sn intermetallic compound layer become large, since the recessed and projected portions in the Cu—Sn intermetallic compound layer act as a resistance with respect to inserting and drawing when used for a connector, the effect of reducing the inserting and drawing force is insufficient.

In addition, if the average thickness of the $Cu_3Sn$ layer which covers the Ni-based base layer is less than 0.01 μm, the effect of suppressing diffusion of the Ni-based base layer is insufficient. In addition, if the thickness of the $Cu_3Sn$ layer exceeds 0.5 μm, the $Cu_3Sn$ layer turns into a $Cu_6Sn_5$ layer at a high temperature, and the Sn-based surface layer is reduced so that the contact resistance increases, which is not preferable.

This average thickness is an average value of thicknesses measured at a plurality of locations in the $Cu_3Sn$ layer.

In the conductive member of the invention, it is more preferable to interpose a Fe-based base layer between the Cu-based substrate and the Ni-based base layer, and the thickness of the Fe-based base layer is preferably 0.1 μm to 1.0 μm.

In the conductive member, since Fe has a diffusion rate into $Cu_6Sn_5$ slower than that of Ni, the Fe-based base layer effectively functions as a barrier layer with a high heat resistance at a high temperature and thus can maintain the contact resistance of the surface at a low level in a stable manner. In addition, since Fe is hard, the Fe-based base layer develops high abrasion resistance in the use of a connector terminal or the like. Additionally, by interposing the Ni-based base layer between the Fe-based base layer and the Cu—Sn intermetallic compound layer, it is possible to maintain favorable adhesion between the Fe-based base layer and the Cu—Sn intermetallic compound layer. In summary, since Fe and Cu do not form a solid-solution and do not form intermetallic compounds, mutual diffusion of atoms does not occur in the interface of the layers, and thus adhesiveness therebetween cannot be obtained, but it is possible to improve adhesiveness thereof by interposing Ni elements that can form a solid-solution with both Fe and Cu as a binder between Fe and Cu.

In addition, since the Ni-based base layer is coated on Fe which is liable to be corroded by an external environment so as to form oxides, there is an effect of preventing Fe from moving to the surface from the Sn plating defect portions so as to form Fe oxides.

In this case, if the Fe-based base layer is as small as less than 0.1 μm, the Cu diffusion prevention function of the Cu-based substrate 1 is not sufficient, and, if the Fe-based base layer exceeds 1.0 μm, the Fe-based base layer is easily cracked during a bending process, which is not preferable.

In addition, the method for producing conductive members of the invention is a method for producing a conductive member by plating Ni or an Ni alloy, Cu or a Cu alloy, and Sn or an Sn alloy in this order on the surface of a Cu-based substrate so as to form a plated layer respectively, and then performing heating and a reflow treatment on the plated layers so as to sequentially form an Ni-based base layer, a Cu—Sn intermetallic compound layer, and an Sn-based surface layer on the Cu-based substrate, in which the plated layer of the Ni or Ni alloy is formed by electrolytically plating with a current density of 20 A/$dm^2$ to 50 A/$dm^2$; the plated layer of the Cu or Cu alloy is formed by electrolytically plating with a current, density of 20 A/$dm^2$ to 60 A/$dm^2$; the plated layer of the Sn or Sn alloy is formed by electrolytically plating with a current density of 10 A/$dm^2$ to 30 A/$dm^2$; and the reflow treatment includes a heating process in which the plated layers are heated to a peak temperature of 240° C. to 300° C. at a heating rate of 20° C./second to 75° C./second after 1 minute to 15 minutes has elapsed from the formation of the plated layers; a primary cooling process in which the plated layers are cooled for 2 seconds to 10 seconds at a cooling rate of 30° C./second or lower after being heated to the peak temperature; and a secondary cooling process in which the plated layers are cooled at a cooling rate of 100° C./second to 250° C./second after the primary cooling process.

Cu plating at a high current density increases the grain boundary density, which helps formation of uniform alloy layers and also enables formation of a $Cu_3Sn$ layer with a high coverage. The reason why the current density of the Cu plating was set to 20 A/$dm^2$ to 60 A/$dm^2$ is that, if the current density is lower than 20 A/$dm^2$, since the reaction activity of Cu plated crystals is insufficient, the effect of forming smooth intermetallic compounds during alloying is insufficient. On the other hand, if the current density exceeds 60 A/$dm^2$, since the smoothness of the Cu plated layer becomes low, it is not possible to form smooth Cu—Sn intermetallic compound layers.

In addition, the reason why the current density of the Sn plating was set to 10 A/$dm^2$ to 30 A/$dm^2$ is that, if the current density is lower than 10 A/$dm^2$, since the grain boundary density of Sn becomes low, the effect of forming smooth Cu—Sn intermetallic compound layers during alloying is insufficient, and, on the other hand, if the current density exceeds 30 A/$dm^2$, the current efficiency is remarkably decreased, which is not preferable.

In addition, by setting the current density of the Ni plating to 20 A/$dm^2$ or higher, crystal grains are micronized, and diffusion of Ni atoms into Sn or intermetallic compounds during heating after being reflowed or productized becomes difficult so that Ni plating deficits are reduced, and thus it is possible to prevent generation of Kirkendall voids. On the other hand, if the current density exceeds 50 A/$dm^2$, hydrogen is intensively generated on the plated surface during electrolysis, and bubble adherence generates pin holes in the films, at this time point the Cu-based substrate in the base starts to diffuse and thus makes Kirkendall voids to be generated easily. Therefore, the current density of the Ni plating is desirably 20 A/$dm^2$ to 50 A/$dm^2$.

In addition, with regard to Cu and Sn electrocrystallized at a high current density, the stability is low, and alloying or crystal grain enlargement occurs even at a room temperature so that it becomes difficult to produce a desired intermetallic compound structure in the reflow treatment. Therefore, it is desirable to perform the reflow treatment rapidly after the plating treatment. Specifically, it is preferable to perform the reflow treatment within 15 minutes, and more preferably within 5 minutes.

By performing the plating treatment of Cu or a Cu alloy and Sn or an Sn alloy at a current density higher than that in the related art and by performing the reflow treatment rapidly after the plating, Cu and Sn actively react during the reflow, and the Ni-based base layer is widely covered with the $Cu_3Sn$ layer so that a uniform $Cu_6Sn_5$ layer is generated.

In addition, in the reflow treatment, if the heating rate is lower than 20° C./second in the heating process, since Cu atoms preferentially diffuse into the grain boundary of Sn and thus intermetallic compounds abnormally grow in the vicinity of the grain boundary while the Sn plating is melted, it is difficult for a $Cu_3Sn$ layer with a high coverage to form. On the other hand, if the heating rate exceeds 75° C./second, intermetallic compounds do not grow sufficiently, and the Cu plating excessively remains so that it is impossible to obtain a desired intermetallic compound layer in the subsequent cooling.

In addition, if the peak temperature in the heating process is lower than 240° C., Sn is not uniformly melted, and, if the peak temperature exceeds 300° C., intermetallic compounds grow abruptly and thus the recessed and projected portions in the Cu—Sn metallic compound layer become large, both of which are not preferable.

Furthermore, in the cooling process, by providing the primary cooling process with a low cooling rate, Cu atoms slowly diffuse into Sn grains and thus grow as a desired intermetallic compound structure. If the cooling rate of the primary cooling process exceeds 30° C./second, abrupt cooling prevents the growth of intermetallic compounds from growing in a smooth shape, and the recessed and projected portions become large. Even with a cooling time of less than 2 seconds, likewise, intermetallic compounds cannot grow in a smooth shape. If the cooling time exceeds 10 seconds, the $Cu_6Sn_5$ layer grows excessively, and thus the coverage of the $Cu_3Sn$ layer is decreased. Air cooling is appropriate for the primary cooling process.

Additionally, after the primary cooling process, the intermetallic compound layer is quenched by the secondary cooling process so as to complete the growth in a desired structure. If the cooling rate in the secondary cooling process is slower than 100° C./second, intermetallic compounds proceed further, and thus a desired shape of the intermetallic compound cannot be obtained.

By finely controlling the electrocrystallization conditions and reflow conditions of the plating as such, it is possible to obtain a Cu—Sn intermetallic compound layer in a two-layer structure with a small number of recessed and projected portions and a high coverage rate by the $Cu_3Sn$ layer.

In addition, the method for producing conductive members of the invention is a method for producing a conductive member by plating Fe or an Fe alloy, Ni or an Ni alloy, Cu or a Cu alloy, and Sn or an Sn alloy in this order on the surface of a Cu-based substrate so as to form a plated layer respectively, and then performing heating and a reflow treatment on the plated layers so as to sequentially form an Fe-based base layer, an Ni-based base layer, a Cu—Sn intermetallic compound layer, and an Sn-based surface layer on the Cu-based substrate characterized in that the plated layer of the Fe or Fe alloy is formed by electrolytically plating with a current density of 5 A/$dm^2$ to 25 A/$dm^2$; the plated layer of the Ni or the Ni alloy is formed by electrolytically plating with a current density of 20 A/$dm^2$ to 50 A/$dm^2$; the plated layer of the Cu or the Cu alloy is formed by electrolytically plating with a current density of 20 A/$dm^2$ to 60 A/$dm^2$; the plated layer of the Sn or the Sn alloy is formed by electrolytically plating with a current density of 10 A/$dm^2$ to 30 A/$dm^2$; and the reflow treatment includes a heating process in which the plated layers are heated to a peak temperature of 240° C. to 300° C. at a heating rate of 20° C./second to 75° C./second after 1 minute to 15 minutes has elapsed from the formation of the plated layers; a primary cooling process in which the plated layers are cooled for 2 seconds to 10 seconds at a cooling rate of 30° C./second or lower after being heated to the peak temperature; and a secondary cooling process in which the plated layers are cooled at a cooling rate of 100° C./second to 250° C./second after the primary cooling process.

If the current density of the Fe plating is lower than 5 A/$dm^2$, Fe plated grains are enlarged, and the effect of suppressing the diffusion of Sn is insufficient, on the other hand, if the current density exceeds 25 A/$dm^2$, pin holes due to generation of hydrogen becomes liable to occur, both of which are not preferable.

Advantageous Effects of Invention

According to the invention, it is possible to prevent diffusion of Cu at a high temperature and favorably maintain the surface state so as to suppress an increase in the contact resistance; to suppress separation of plated layer or generation of Kirkendall voids; and, furthermore, to reduce the inserting and drawing force when used for a connector so as to suppress variation thereof by appropriately coating an Ni-based base layer among Cu—Sn intermetallic compound layers in a two-layer structure with a $Cu_3Sn$ layer constituting the bottom layer, and also further forming a $Cu_6Sn_5$ layer thereon.

DESCRIPTION OF EMBODIMENTS

Hereinafter, embodiments of the invention will be described.

First Embodiment

Figure 1:
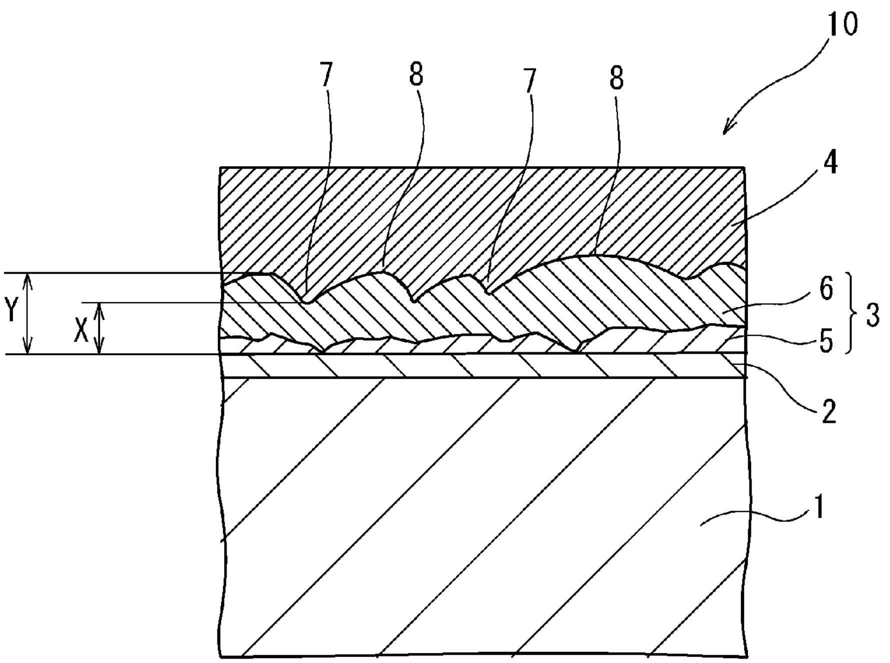
FIG. 1 is a cross-sectional view showing a modeled surface layer portion of the first embodiment of the conductive member according to the invention.

Firstly, the first embodiment will be described. A conductive member 10 in the first embodiment is one that is used, for example, as a terminal in an in-vehicle connector of an automobile, and, as shown in FIG. 1, has a Cu—Sn intermetallic compound layer 3 and an Sn-based surface layer 4 formed in this order on the surface of a Cu-based substrate 1 through an Ni-based base layer 2, and, furthermore, the Cu—Sn intermetallic compound layer 3 is composed of a $Cu_3Sn$ layer 5 and a $Cu_6Sn_5$ layer 6.

The Cu-based substrate 1 is, for example, plate-like and is composed of Cu or a Cu alloy. With regard to the Cu alloy, the material is not necessarily limited, but a Cu—Zn-based alloy, a Cu—Ni—Si-based (Corson-based) alloy, a Cu—Cr—Zr-based alloy, a Cu—Mg—P-based alloy, a Cu—Fe—P-based alloy, and a Cu—Sn—P-based alloy are preferable, and, for example, MSP1, MZC1, MAX251C, MAX375, and MAX126 (manufactured by Mitsubishi Shindob Co., Ltd.) are preferably used.

The Ni-based base layer 2 is formed by electrolytically plating Ni or an Ni alloy and is formed on the surface of the Cu-based substrate 1 with a thickness of, for example, 0.1 μm to 0.5 μm. If the Ni-based base layer 2 is as thin as less than 0.1 μm, the Cu diffusion prevention function of the Cu-based substrate 1 is not sufficient, and, if the Ni-based base layer 2 is as thick as more than 0.5 μm, strain becomes great and thus separation is liable to occur, and also cracks become liable to occur during a bonding process.

The Cu—Sn intermetallic compound layer 3 is an alloy layer formed by diffusion of Cu plated on the Ni-based base layer 2 as described below and Sn on the surface by a reflow treatment. Furthermore, the Cu—Sn intermetallic compound layer 3 is composed of the $Cu_3Sn$ layer 5 arranged on the Ni-based base layer 2 and the $Cu_6Sn_5$ layer 6 arranged on the $Cu_3Sn$ layer 5. In this case, the entire Cu—Sn intermetallic compound layer 3 forms recessed and projected portions, and the combined thicknesses X of the $Cu_3Sn$ layer 5 and the $Cu_6Sn_5$ layer 6 in the recessed portions 7 are 0.05 μm to 1.5 μm.

If the combined thicknesses X of the recessed portions 7 are smaller than 0.05 μm, Sn diffuses into the Ni-based base layer 2 at a high temperature, and thus there is a concern that deficits in the Ni-based base layer 2 may occur. Sn constituting the surface layer 4 is the component that maintains the contact resistance of the terminal at a low level, but, if deficits occur in the Ni-based base layer 2, Cu in the Cu-based substrate 1 diffuses, and thus the Cu—Sn alloy layer 3 grows so that the $Cu_6Sn_5$ layer 6 reaches the surface of the conductive member 10, whereby Cu oxides are formed on the surface, and thus the contact resistance is increased. In addition, at this time, due to diffusion of Cu from the deficits in the Ni-based base-layer 2, Kirkendall voids are also liable to occur in the interface. Therefore, the combined thicknesses X of the recessed portions 7 needs to be a minimum of 0.05 μm, and is more preferably 0.1 μm.

On the other hand, if the combined thicknesses X of the $Cu_3Sn$ layer 5 and the $Cu_6Sn_5$ layer 6 in the recessed portions 7 exceed 1.5 μm, the Cu—Sn intermetallic compound layer 3 becomes brittle, and thus plated film layers become liable to be separated during a bonding process.

In addition, the ratio of the thicknesses of the projected portions 8 to the thicknesses of the recessed portions 7 in the Cu—Sn intermetallic compound layer 3 is set to 1.2 to 5. If the ratio is decreased and thus the recessed and projected portions on the Cu—Sn intermetallic compound layer 3 become small, the inserting and drawing force is reduced when using a connector, which is preferable, but, if the ratio is less than 1.2, the recessed and projected portions on the Cu—Sn intermetallic compound layer 3 almost disappear, and thus the Cu—Sn intermetallic compound layer 3 becomes remarkably brittle so that films become liable to be separated during a bonding process. In addition, if the recessed and projected portions become large such that the ratio of the thicknesses of the projected portions 8 to the thicknesses of the recessed portions 7 exceeds 5, the recessed and projected portions on the Cu—Sn intermetallic compound layer 3 provide resistance with respect to insertion and drawing when used for a connector, and therefore the effect of reducing the inserting and drawing force is insufficient.

With respect to the ratio of the projected portions 8 to the recessed portions 7, if the combined thicknesses X of the recessed portions 7 are 0.3 μm, and the thicknesses Y of the projected portions 8 are 0.5 μm, the ratio (Y/X) is 1.67. In this case, the thickness of the Cu—Sn intermetallic compound layer 3 obtained by bonding the $Cu_3Sn$ layer 5 and the $Cu_6Sn_5$ layer 6 is desirably set to a maximum of 2 μm.

In addition, the $Cu_3Sn$ layer 5 arranged on the bottom layer of the Cu—Sn intermetallic compound layer 3 covers the Ni-based base layer 2, and the area coverage is set to 60% to 100%. If the area coverage becomes as low as less than 60%, Ni atoms in the Ni-based base layer 2 diffuse to the $Cu_6Sn_5$ layer 6 from uncovered portions at a high temperature, and thus there is a concern of deficits in the Ni-based base layer 2 occurring. Additionally, due to diffusion of Cu in the Cu-based substrate 1 from the deficit portions, the Cu—Sn intermetallic compound layer 3 grows and reaches the surface of the conductive member 10 so that Cu oxides are formed on the surface and the contact resistance is increased. In addition, the diffusion of Cu from the deficit portions in the Ni-based base layer 2 also makes Kirkendall voids liable to occur.

By covering at least 60% or more of the Ni-based base layer 2 with the $Cu_3Sn$ layer 5, it is possible to prevent an increase in the contact resistance or occurrence of Kirkendall voids at a high temperature. It is more desirable to cover 80% or more of the Ni-based base layer 2.

The area coverage can be confirmed from scanning ion microscope images (SIM images) obtained by performing a cross-section process on films with a focused ion beam (FIB) and then observing the surfaces with a scanning ion microscope.

The fact that the area coverage with respect to the Ni-based base layer 2 is 60% or higher indicates that, when the area coverage does not reach 100%, there occur local portions on the surface of the Ni-based base layer 2 in which the $Cu_3Sn$ layer 5 is not present, but, even in this case, since the combined thicknesses of the $Cu_3Sn$ layer 5 and the $Cu_6Sn_5$ layer 6 in the recessed portions 7 in the Cu—Sn intermetallic compound layer 3 are set to 0.05 μm to 1.5 μm, the $Cu_6Sn_5$ layer 6 covers the Ni-based base layer 2 with a thickness of 0.05 μm to 1.5 μm.

In addition, the average thickness of the $Cu_3Sn$ layer 5, which constitutes the bottom layer of the Cu—Sn intermetallic compound layer 3, is set to 0.01 μm to 0.5 μm. Since the $Cu_3Sn$ layer 5 is a layer that covers the Ni-based base layer 2, if the average thickness thereof is as small as less than 0.01 μm, the effect of suppressing diffusion of the Ni-based base layer 2 becomes poor. In addition, if the thickness exceeds 0.5 μm, the $Cu_3Sn$ layer 5 turns into the Sn-rich $Cu_6Sn_5$ layer 6 at a high temperature, and thus the Sn-based surface layer 4 is reduced by that amount, and the contact resistance increases, which is not preferable. This average thickness is an average value of thicknesses measured at a plurality of locations in portions in which the $Cu_3Sn$ layer 5 is present.

Meanwhile, since the Cu—Sn intermetallic compound layer 3 is alloyed by diffusion of Cu plated on the Ni-based base layer 2 and Sn on the surface, there are cases, depending on the conditions of a reflow treatment or the like, in which the entire Cu plated layer, which acts as a base, diffuses so as to become the Cu—Sn intermetallic compound layer 3, but there are also cases in which the Cu plated layer remains. When the Cu plated layer remains, the thickness of the Cu plated layer is set to, for example, 0.01 μm to 0.1 μm.

The Sn-based surface layer 4 in the outermost layer is formed by electrolytically plating Sn or an Sn alloy and then performing a reflow treatment, and is formed with a thickness of, for example, 0.05 μm to 2.5 μm. If the thickness of the Sn-based surface layer 4 is less than 0.05 μm, Cu diffuses at a high temperature so that Cu oxides become liable to be formed on the surface, which increases the contact resistance and also degrades solderability or corrosion resistance. On the other hand, if the thickness exceeds 2.5 μm, the effect of hardening the base of the surface by the Cu—Sn intermetallic compound layer 3 present in the bottom layer of the soft Sn-based surface layer 4 fades so that the inserting and drawing force is increased when used for a connector and it is difficult to achieve reduction of the inserting and drawing force due to the increasing number of pins of the connectors.

Next, a method for producing such a conductive member will be described.

Firstly, as a Cu-based substrate, a plate material of Cu or a Cu alloy is prepared and subjected to degreasing, pickling, or the like to wash the surface, and then Ni plating, Cu plating, and Sn plating are sequentially performed in this order. In addition, between each plating process, a degreasing or water washing process is performed.

As the conditions of the Ni plating, a Watts bath using nickel sulfate ($NiSO_4$) and boric acid ($H_3BO_3$) as the main components, a sulfamate bath using nickel sulfamate ($Ni(NH_2SO_3)_2$) and boric acid ($H_3BO_3$) as the main components, or the like is used as a plating bath. There are cases in which nickel chloride ($NiCl_2$) or the like is added as salts that facilitate oxidation reactions. In addition, the plating temperature is set to 45° C. to 55° C., and the current density is set to 20 $A/dm^2$ and 50 $A/dm^2$.

As the conditions of the Cu plating, a copper sulfate bath using copper sulfate ($CuSO_4$) and sulfuric acid ($H_2SO_4$) as the main components is used, and chlorine ions ($Cl^-$) are added for leveling. The plating temperature is set to 35° C. to 55° C., and the current density is set to 20 $A/dm^2$ and 60 $A/dm^2$.

As the conditions of the Sn plating, a sulfate bath using sulfuric acid ($H_2SO_4$) and tin sulfate ($SnSO_4$) as the main components is used as a plating bath, the plating temperature is set to 15° C. to 35° C., and the current density is set to 10 $A/dm^2$ and 30 $A/dm^2$.

All of the plating processes are performed at a current density higher than that of general plating techniques. In this case, a stirring technique of a plating solution becomes important, and by adopting a method in which a plating solution is sprayed toward a treatment plate at a high speed, a method in which a plating solution is flowed in parallel to a treatment plate, or the like, it is possible to rapidly supply a fresh plating solution to the surface of the treatment plate and to form a uniform plated layer within a short time with a high current density. The flow rate of the plating solution is desirably 0.5 m/second or higher in the surface of the treatment plate. In addition, in order to enable a plating treatment at a current density one order of magnitude higher than that of the related art, it is desirable to use an insoluble anode, such as a Ti plate or the like covered with iridium oxide ($IrO_2$) with a high anode limiting current density, as an anode.

A summary of each of the plating conditions is as shown in Tables 1 to 3 below.

TABLE 1

| Conditions of Ni plating | | |
|---|---|---|
| Composition | $NiSO_4$ | 300 g/L |
| | $H_3BO_3$ | 30 g/L |
| Condition | Temperature | 45° C. to 55° C. |
| | Current density | 20 $A/dm^2$ to 50 $A/dm^2$ |
| | Solution flow rate | 0.5 m/second or greater |
| | Anode | Iridium oxide coated titanium |

TABLE 2

| Conditions of Cu plating | | |
|---|---|---|
| Composition | $CuSO_4$ | 250 g/L |
| | $H_2SO_4$ | 60 g/L |
| | $Cl^-$ | 50 mg/L |
| Condition | Temperature | 35° C. to 55° C. |
| | Current density | 20 $A/dm^2$ to 60 $A/dm^2$ |
| | Solution flow rate | 0.5 m/second or greater |
| | Anode | Iridium oxide coated titanium |

TABLE 3

| Conditions of Sn plating | | |
|---|---|---|
| Composition | $SnSO_4$ | 60 g/L |
| | $H_2SO_4$ | 80 g/L |
| | Polish | 10 mg/L |
| Condition | Temperature | 15° C. to 35° C. |
| | Current density | 10 $A/dm^2$ to 30 $A/dm^2$ |
| | Solution flow rate | 0.5 m/second or greater |
| | Anode | Iridium oxide coated titanium |

Additionally, by performing the three kinds of plating treatments, an Ni-based base layer, a Cu plated layer, and an Sn plated layer are sequentially formed on the Cu-based substrate.

Next, heating and a reflow treatment are performed. In the reflow treatment, it is desirable to follow the conditions of the temperature profile shown in FIG. 2.

That is, the reflow treatment is a treatment including a heating process in which a treated material after the plating is heated to a peak temperature of 240° C. to 300° C. at a heating rate of 20° C./second to 75° C./second for 2.9 seconds to 11 seconds in a heating furnace with a CO reductive atmosphere, a primary cooling process in which the material is cooled for 2 seconds to 10 seconds at a cooling rate of 30° C./second or lower after being heated to the peak temperature, and a secondary cooling process in which the material is cooled for 0.5 seconds to 5 seconds at a cooling rate of 100° C./second to 250° C./second after the primary cooling process. The primary and secondary cooling processes are performed by air cooling and water cooling using water of 10° C. to 90° C., respectively.

By performing the reflow treatment in a reductive atmosphere, it becomes possible to prevent generation of tin oxide films with a high melting point on the Sn plated surface and to perform the reflow treatment at a lower temperature and within a shorter time, which facilitates production of a desired intermetallic compound structure. In addition, by dividing the cooling process into two steps and providing the primary cooling process with a low cooling rate, Cu atoms gently diffuse in Sn grains and a desired intermetallic compound structure grows. Additionally, by performing quenching after that, it is possible to prevent the growth of the intermetallic compound layer and to fix the layer to a desired structure.

Meanwhile, Cu and Sn electrocrystallized with a high current density are at a low stability and are alloyed or cause crystal grain enlargement even at room temperature, and therefore it becomes difficult to produce a desired intermetallic compound structure with the reflow treatment. Therefore, it is desirable to perform a reflow treatment rapidly after a plating treatment. Specifically, it is necessary to perform the reflow treatment within 15 minutes, and desirably within 5 minutes. A short idle time after plating is not a problem, however, in ordinary treatment lines, the idle time is about 1 minute in the configuration.

Figure 2:
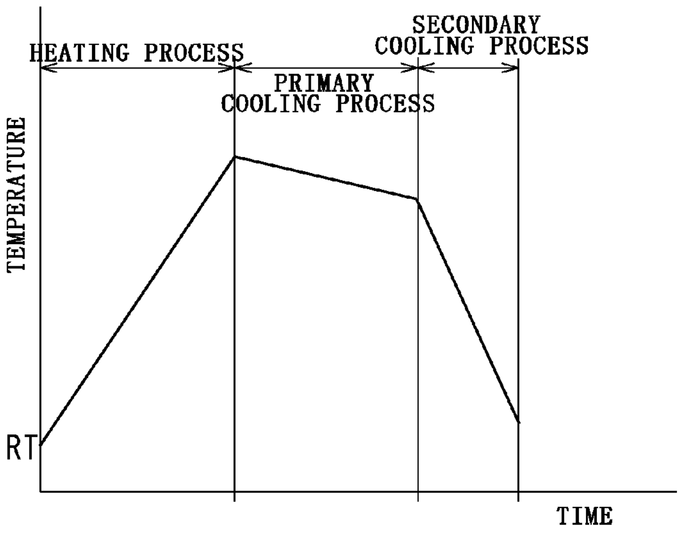
FIG. 2 is a temperature profile showing the graphed relationship between temperature and time of the reflow conditions according to the producing method of the invention.

As shown above, by performing three-layer plating under the plating conditions shown in Tables 1 to 3 on the surface of the Cu-based substrate 1 and then performing the reflow treatment under the temperature profile conditions shown in FIG. 2, as shown in FIG. 1, the Ni-based base layer 2 formed on the surface of the Cu-based substrate 1 is covered with the $Cu_3Sn$ layer 5, and the $Cu_6Sn_5$ layer 6 is further formed thereon, and the Sn-based surface layer 4 is formed on the outermost surface.

EXAMPLE 1

Next, an example of the first embodiment will be described.

As a Cu alloy plate (the Cu-based substrate), 0.25 mm-thick MAX251C (manufactured by Mitsubishi Shindoh Co., Ltd.) was used, and plating treatments of Ni, Cu, and Sn were sequentially performed. In this case, as shown in Table 4, a plurality of test specimens was prepared with varied current densities in each of the plating treatments. The target thickness of each plated layer was set to 0.3 μm for the Ni plated layer, 0.3 μm for the Cu plated layer, and 1.5 μm for the Sn plated layer. In addition, water washing processes were inserted between the three kinds of plating processes to wash out plating solutions from the surfaces of treated materials.

In the plating treatment in the present example, plating solutions were sprayed to the Cu alloy plate at a high speed, and an insoluble anode of a Ti plate covered with iridium oxide was used.

After performing the three kinds of plating treatments, reflow treatments were performed on the treated materials. The reflow treatments were performed 1 minute after the last Sn plating treatment and the heating process, the primary cooling process, and the secondary cooling process were performed under a variety of conditions.

The above test conditions are summarized in Table 4.

TABLE 4

| Specimens | | Plating current density (A/dm$^2$) Ni | Cu | Sn | Heating Rate (C./s) | Heating Peak Temp. (C.) | Primary cooling Rate (C./s) | Primary cooling Time (s) | Secondary cooling Rate (C./s) | Ni-based base layer (m) | Cu—Sn intermetallic compound layer: $Cu_3Sn$ Avg. film thickness (m) | $Cu_3Sn$ Area coverage (%) | Thickness at recessed portions: X (m) | Thickness at projected portions: Y (m) | Recess and projection ratio Y/X | Min. film thickness of Sn-based surface layer (m) |
|---|---|---|---|---|---|---|---|---|---|---|---|---|---|---|---|---|
| Examples | 1 | 40 | 30 | 30 | 40 | 270 | 20 | 5 | 170 | 0.3 | 0.01 | 60 | 0.05 | 0.25 | 5 | 1.5 |
| | 2 | 40 | 40 | 20 | 40 | 270 | 20 | 5 | 170 | 0.3 | 0.03 | 90 | 1.5 | 1.8 | 1.2 | 0.5 |
| | 3 | 40 | 50 | 20 | 40 | 270 | 20 | 5 | 170 | 0.3 | 0.1 | 100 | 1.5 | 1.8 | 1.2 | 0.5 |
| | 4 | 40 | 40 | 30 | 40 | 270 | 20 | 5 | 170 | 0.3 | 0.4 | 100 | 0.1 | 0.5 | 4 | 1 |
| | 5 | 20 | 40 | 20 | 40 | 270 | 20 | 5 | 170 | 0.15 | 0.05 | 70 | 0.08 | 0.34 | 4.25 | 0.1 |
| | 6 | 50 | 40 | 10 | 40 | 270 | 20 | 5 | 170 | 0.4 | 0.2 | 100 | 0.3 | 0.75 | 2.5 | 0.05 |
| | 7 | 40 | 40 | 20 | 20 | 250 | 10 | 10 | 100 | 0.3 | 0.1 | 80 | 0.5 | 1 | 2 | 0.5 |
| | 8 | 40 | 40 | 20 | 40 | 240 | 20 | 3 | 150 | 0.3 | 0.1 | 80 | 0.2 | 0.4 | 2 | 0.5 |
| | 9 | 40 | 40 | 20 | 50 | 280 | 30 | 2 | 200 | 0.3 | 0.05 | 70 | 0.2 | 0.84 | 4.2 | 0.3 |
| | 10 | 40 | 40 | 20 | 50 | 280 | 20 | 5 | 200 | 0.3 | 0.2 | 70 | 0.3 | 1.35 | 4.5 | 0.4 |
| | 11 | 40 | 40 | 20 | 60 | 300 | 20 | 5 | 200 | 0.3 | 0.05 | 60 | 0.08 | 0.32 | 4 | 1 |
| | 12 | 40 | 40 | 20 | 75 | 300 | 20 | 5 | 250 | 0.3 | 0.1 | 60 | 0.06 | 0.3 | 5 | 0.5 |
| Comparative Examples | 13 | 40 | 40 | 20 | 15 | 270 | 20 | 5 | 170 | 0.3 | 0.01 | 40 | 0.05 | 0.1 | 2 | 1 |
| | 14 | 40 | 40 | 20 | 80 | 270 | 20 | 5 | 170 | 0.3 | 0.04 | 60 | 0.02 | 0.05 | 2.5 | 1 |
| | 15 | 40 | 40 | 20 | 40 | 230 | 20 | 5 | 170 | 0.3 | 0.2 | 70 | 0.1 | 0.6 | 6 | 0.03 |
| | 16 | 40 | 40 | 20 | 40 | 310 | 20 | 5 | 170 | 0.3 | 0.2 | 70 | 0.2 | 1.7 | 8.5 | 0.2 |
| | 17 | 40 | 40 | 20 | 40 | 270 | 35 | 5 | 170 | 0.3 | 0.05 | 60 | 0.2 | 1.48 | 7.4 | 0.1 |
| | 18 | 40 | 40 | 20 | 40 | 270 | 20 | 1 | 170 | 0.3 | 0.03 | 60 | 0.08 | 0.45 | 5.63 | 0.15 |
| | 19 | 40 | 40 | 20 | 40 | 270 | 20 | 11 | 170 | 0.3 | 0.01 | 40 | 0.5 | 2.25 | 4.5 | 0.05 |
| | 20 | 40 | 40 | 20 | 40 | 270 | 20 | 5 | 95 | 0.3 | 0.05 | 50 | 0.05 | 0.23 | 4.6 | 0.05 |
| | 21 | 40 | 40 | 20 | 40 | 270 | 20 | 5 | 260 | 0.3 | 0.05 | 60 | 0.5 | 4.3 | 8.6 | 0.05 |

TABLE 4-continued

| Specimens | Plating current density (A/dm$^2$) Ni | Plating current density (A/dm$^2$) Cu | Plating current density (A/dm$^2$) Sn | Heating Rate (C./s) | Heating Peak Temp. (C.) | Primary cooling Rate (C./s) | Primary cooling Time (s) | Secondary cooling Rate (C./s) | Ni-based base layer (m) | Cu—Sn intermetallic compound layer: $Cu_3Sn$ Avg. film thickness (m) | Cu—Sn intermetallic compound layer: $Cu_3Sn$ Area coverage (%) | Cu—Sn intermetallic compound layer: Thickness at recessed portions: X (m) | Cu—Sn intermetallic compound layer: Thickness at projected portions: Y (m) | Cu—Sn intermetallic compound layer: Recess and projection ratio Y/X | Min. film thickness of Sn-based surface layer (m) |
|---|---|---|---|---|---|---|---|---|---|---|---|---|---|---|---|
| 22 | 15 | 40 | 20 | 40 | 270 | 20 | 5 | 170 | 0.1 | 0.05 | 60 | 0.05 | 0.38 | 7.6 | 0.05 |
| 23 | 60 | 40 | 10 | 40 | 270 | 20 | 5 | 170 | 0.5 | 0.05 | 60 | 0.2 | 1.3 | 6.5 | 0.1 |
| 24 | 40 | 15 | 15 | 40 | 270 | 20 | 5 | 170 | 0.3 | <0.01 | 50 | 0.03 | 0.15 | 5 | 0.03 |
| 25 | 30 | 65 | 20 | 40 | 270 | 20 | 5 | 170 | 0.2 | 0.3 | 70 | 1.8 | 5.4 | 3 | 0.04 |
| 26 | 40 | 40 | 5 | 40 | 270 | 20 | 5 | 170 | 0.3 | 0.05 | 60 | 1.6 | 10.4 | 6.5 | 0.03 |
| 27 | 30 | 30 | 40 | 40 | 270 | 20 | 5 | 170 | 0.2 | 0.6 | 80 | 1 | 3.6 | 3.6 | 1.7 |
| 28 | 10 | 10 | 5 | 40 | 270 | 20 | 5 | 170 | 0.1 | 0.05 | 50 | 0.05 | 0.41 | 8.2 | 0.05 |
| 29 | 2 | 2 | 2 | 40 | 270 | 20 | 5 | 170 | 0.05 | <0.01 | 40 | 0.02 | 0.1 | 5 | 0.02 |

From the results of an energy dispersion type X-ray spectroscopic analysis using a transmission electron microscope (TEM-EDS analysis), the cross-sections of the treated materials in the example were composed of a four-layer structure of the Cu-based substrate, the Ni-based base layer, the $Cu_3Sn$ layer, the $Cu_6Sn_5$ layer, and the Sn-based surface layer, in which recessed and projected portions were present on the surface of the $Cu_6Sn_5$ layer, and the thicknesses of the recessed portions were 0.05 µm or larger. In addition, a discontinuous $Cu_3Sn$ layer was present in the interface between the $Cu_6Sn_5$ layer and the Ni-based base layer, and the surface coverage of the $Cu_3Sn$ layer with respect to the Ni-based base layer, which was observed with scanning ion microscope of the cross-sections by focused ion beam (FIB-SIM images), was 60% or higher.

Figure 3:
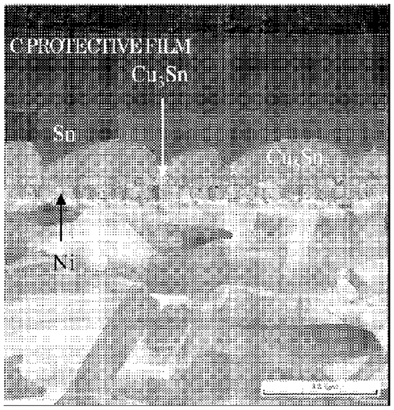
FIG. 3 is a cross-sectional microphotograph of the surface layer portion in an example of the conductive member of the first embodiment.
Figure 4:
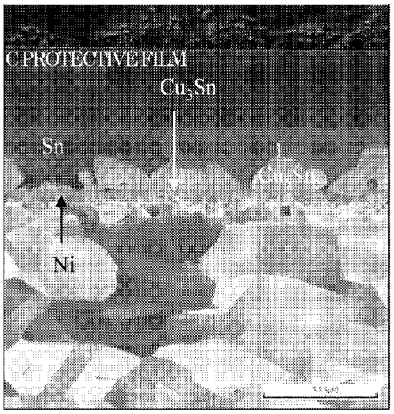
FIG. 4 is a cross-sectional microphotograph of the surface layer portion of the conductive member in a comparative example.

The results of the cross-section observation performed on specimen 1 from the example and specimen 29 from the comparative examples among the test specimens are shown in FIGS. 3 and 4. FIGS. 3 and 4 are microphotographing images of the cross-sections of test specimen Nos. 1 and 29, respectively. In test specimen No. 1 of the example, the $Cu_6Sn_5$ layer had grown, but the Sn-based surface layer still remained. On the other hand, in the cross-section of test specimen No. 29, the Ni-based base layer had been fractured, and little Sn-based surface layer remained so that the $Cu_6Sn_5$ layer reached the surface, and Cu oxides covered the terminal surface.

With respect to specimens prepared with the conditions shown in Table 4, the contact resistances, presence of separation, and presence of Kirkendall voids after 175° C.×1000 hours had elapsed were measured. In addition, the coefficients of kinetic friction were also measured.

The contact resistances were measured using an electric contact resistance tester (manufactured by Yamazaki Seiki Co., Ltd.) under conditions of a sliding load of 0.49 N (50 gf) after leaving the specimens idle for 175° C.×1000 hours.

As the separation tests, after performing 90° bending (radius of curvature R: 0.7 mm) with a load of 9.8 kN, the specimens were retained in the atmosphere for 160° C.×250 hours and bent back, and then the separation states at the bent portions were confirmed. In addition, through the observation of the cross-sections, presence of Kirkendall voids in the interface between the Ni-based base layer and the Cu-based substrate thereunder, which are the causes of separation, was confirmed.

Figure 5:
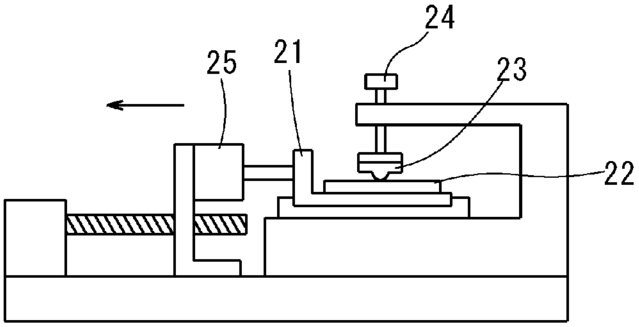
FIG. 5 is a front view showing the concept of an apparatus for measuring the coefficient of kinetic friction of a conductive member.

With regard to the coefficients of kinetic friction, plate-like male specimens and semispherical female specimens with an internal diameter of 1.5 mm were prepared with the respective test specimens so as to simulate the contact portions between the male terminals and the female terminals of an engagement type connector, and then friction forces between both specimens were measured using a horizontal load measuring apparatus (Model-2152NRE, manufactured by Aikoh Engineering Co., Ltd.), thereby obtaining the coefficients of kinetic friction. With reference to FIG. 5, a male specimen 22 was fixed on a horizontal table 21, and the semispherical projected surface of a female specimen 23 was placed thereon so that the plated surfaces came into contact with each other, and a load P of 4.9 N (500 gf) was applied to the female specimen 23 through a weight 24, thereby forming a state in which the male specimen 22 was pressed. In a state in which the load P was applied, a friction force F when the male specimen 22 was extended by 10 mm in a horizontal direction shown by an arrow at a sliding rate of 80 mm/minute was measured through a load cell 25. The coefficients of kinetic friction ($=F_{av}/P$) was obtained from the average value $F_{av}$ of the friction forces F and the load P.

The results are shown in Table 5.

TABLE 5

| Test specimens | | High temperature environment evaluation test: Contact resistance (mΩ) | High temperature environment evaluation test: Presence of separation | High temperature environment evaluation test: Presence of Kirkendall voids | Coefficient of kinetic friction |
|---|---|---|---|---|---|
| Examples | 1 | 5.2 | ○ | ○ | 0.22 |
| | 2 | 2.5 | ○ | ○ | 0.32 |
| | 3 | 3 | ○ | ○ | 0.35 |
| | 4 | 2.5 | ○ | ○ | 0.21 |
| | 5 | 6.1 | ○ | ○ | 0.35 |
| | 6 | 2.6 | ○ | ○ | 0.22 |
| | 7 | 3 | ○ | ○ | 0.23 |
| | 8 | 3.5 | ○ | ○ | 0.25 |
| | 9 | 2 | ○ | ○ | 0.36 |
| | 10 | 2.5 | ○ | ○ | 0.33 |
| | 11 | 4 | ○ | ○ | 0.38 |
| | 12 | 3 | ○ | ○ | 0.38 |
| Comparative Examples | 13 | 7.7 | ○ | X | 0.42 |
| | 14 | 7.8 | ○ | X | 0.44 |
| | 15 | 7.1 | X | X | 0.44 |
| | 16 | 6.3 | X | X | 0.54 |
| | 17 | 5.2 | X | X | 0.53 |
| | 18 | 5.1 | X | X | 0.51 |
| | 19 | 3 | X | ○ | 0.35 |

TABLE 5-continued

| Test specimens | High temperature environment evaluation test Contact resistance (mΩ) | Presence of separation | Presence of Kirkendall voids | Coefficient of kinetic friction |
|---|---|---|---|---|
| 20 | 7.2 | ○ | X | 0.39 |
| 21 | 2 | X | X | 0.58 |
| 22 | 4.5 | ○ | X | 0.52 |
| 23 | 7.2 | X | X | 0.55 |
| 24 | 10.5 | ○ | X | 0.45 |
| 25 | 5.4 | X | X | 0.36 |
| 26 | 5.5 | X | X | 0.58 |
| 27 | 11.2 | ○ | ○ | 0.32 |
| 28 | 7.8 | ○ | X | 0.51 |
| 29 | 12.1 | ○ | X | 0.35 |

As is clear from Table 5, in the conductive member of the invention, since the contact resistance at a high temperature is small, there is no occurrence of separation or Kirkendall voids, and the coefficient of kinetic friction is also small, it can be determined that the inserting and drawing force when used for a connector is also small, which is favorable.

In addition, with regard to the contact resistances, change over time during heating of 175° C.×1000 hours was measured using test specimens No. 6 and 29. The results are shown in FIG. 6.

Figure 6:
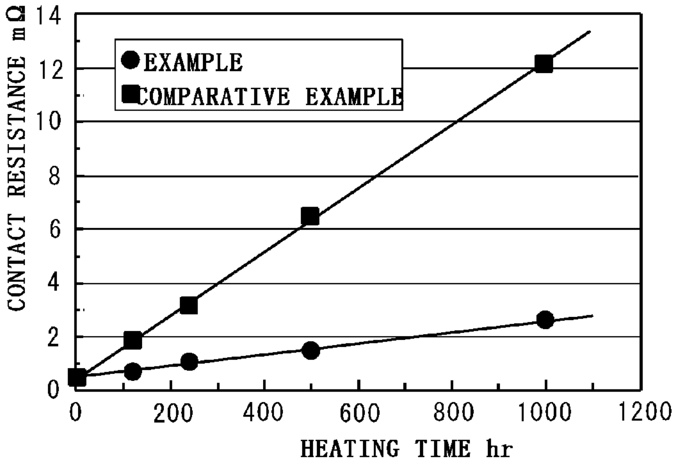
FIG. 6 is a graph showing the change over time of contact resistance in each conductive member of the examples and the comparative examples.

As shown in FIG. 6, while test specimen No. 6 of the invention showed a small increase in the contact resistance even when exposed to a high temperature over an extended period, test specimen No. 29 of the related art showed an increase in the contact resistance of 10 mΩ or more when 1000 hours had elapsed. As described above, while specimen No. 6 of the invention is composed of a four-layer structure in which the Sn-based surface layer remained, test specimen No. 29 of the related art had the Ni-based base layer fractured so that Cu oxides covered the surface, which is considered as a cause of the increase in the contact resistance.

Next, plating separation property due to the idle times after the plating treatment until the reflow treatment was tested. As described above, for the separation tests, after 90° bending (radius of curvature R: 0.7 mm) with a load of 9.8 kN was performed on the specimens, the specimens were retained in the atmosphere at 160° C.×250 hours and bent back, and then the separation states at the bent portions were confirmed. In addition, through the observation of the cross-sections, presence of Kirkendall voids in the interface between the Ni-based base layer and the Cu-based substrate thereunder, which are the causes of separation, was confirmed. The results are shown in Table 6.

TABLE 6

| Idle time between plating and reflow treatment | Plating current density ($A/dm^2$) Ni | Cu | Sn | Evaluation Presence of separation | Kirkendall voids |
|---|---|---|---|---|---|
| 1 minute | 40 | 40 | 20 | ○ | ○ |
| 5 minutes | 40 | 40 | 20 | ○ | ○ |
| 15 minutes | 40 | 40 | 20 | ○ | ○ |
| 30 minutes | 40 | 40 | 20 | ○ | X |
| 60 minutes | 40 | 40 | 20 | X | X |

As can be seen from Table 6, as the idle time after plating becomes longer, separation or Kendall voids occur. This is considered to be because a long idle time causes Cu crystal grains precipitated at a high current density to become enlarged and also, naturally, Cu and Sn react generating $Cu_6Sn_5$ so as to hinder the smooth alloying of $Cu_6Sn_5$ and $Cu_3Sn$ during the reflow. If no smooth Cu—Sn intermetallic compound layer is present, deficits occur in the Ni-based base layer during the heating, which makes Cu atoms in the substrate flow out so as to become liable to generate Kirkendall voids.

The results of the above studies show that the $Cu_6Sn_5$ layer and the $Cu_3Sn$ layer have an effect of preventing the reaction of the Ni-based base layer and the Sn-based surface layer, and, among them, the $Cu_3Sn$ alloy layer is greater in terms of the effect. In addition, it was found that, since Sn atoms diffuse from the recessed portions in the $Cu_6Sn_5$ layer to Ni so as to make Sn and Ni react, the $Cu_6Sn_5$ layer has a relatively small number of recessed and projected portions, and the $Cu_3Sn$ layer covers more of the surface of the Ni-based base layer, and therefore it is possible to prevent degradation of the contact resistance during heating, and also to prevent occurrence of separation or Kirkendall voids, and, furthermore, to reduce the inserting and drawing force when used for a connector. Meanwhile, it is found from the above-described TEM-EDS analysis that 0.76% by weight to 5.32% by weight of Ni is mixed in the $Cu_6Sn_5$ layer, and therefore a small amount of Ni is mixed in the Cu—Sn intermetallic compound layer according to the invention.

Second Embodiment

Figure 7:
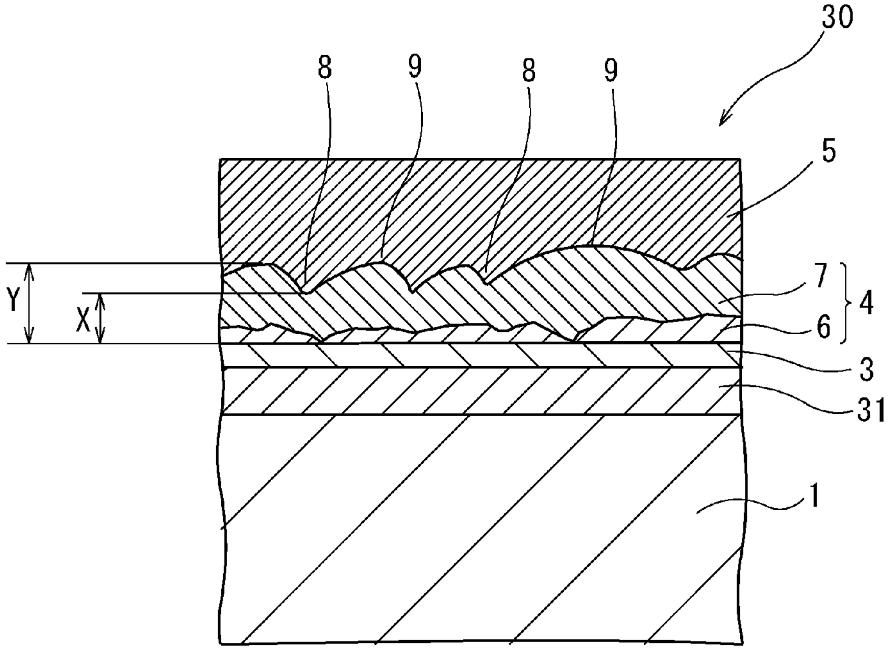
FIG. 7 is a cross-sectional view showing a modeled surface layer portion of the second embodiment of the conductive member according to the invention.

Next, the second embodiment will be described with reference to FIG. 7. In FIG. 7, parts in common with the first embodiment are given the same reference numbers, and description thereof will not be repeated.

As shown in FIG. 7, a conductive member 30 in the second embodiment has the Ni-based base layer 2, the Cu—Sn intermetallic compound layer 3 and the Sn-based surface layer 4 formed in this order on the surface of the Cu-based substrate 1 through an Fe-based base layer 31, and, furthermore, the Cu—Sn intermetallic compound layer 3 is composed of the $Cu_3Sn$ layer 5 and the $Cu_6Sn_5$ layer 6.

The Cu-based substrate 1 is the same as that of the first embodiment.

The Fe-based base layer 31 is formed by electrolytically plating Fe or an Fe alloy and is formed on the surface of the Cu-based substrate 1 with a thickness of 0.1 μm to 1.0 μm. If the Fe-based base layer 31 is as thin as less than 0.1 μm, the Cu diffusion prevention function of the Cu-based substrate 1 is not sufficient, and, if the Fe-based base layer exceeds 1.0 μm, the Fe-based base layer 31 becomes liable to crack during a bending process. As the Fe alloy, for example, an Fe—Ni alloy is used.

The Ni-based base layer 2 is formed on the Fe-based base layer 31. The Ni-based base layer 2 is, similarly to that of the first embodiment, formed by electrolytically plating Ni or an Ni alloy and is formed on the surface of the Fe-based substrate 31 with a thickness of 0.05 μm to 0.3 μm. If the Ni-based base layer 2 is as thin as less than 0.05 μm, there is a concern of diffusion of Ni at a high temperature causing deficit portions and thus separating the layer, and, if the Ni-based base layer 2 exceeds 0.3 μm, the strain increases and thus separation is liable to occur, and also cracks become liable to occur during a bending process.

In addition, both the Cu—Sn intermetallic compound layer 3 and the Sn-based surface layer 4, both of which are formed on the Ni-based base layer 2, are the same as those of the first embodiment; furthermore, the Cu—Sn intermetallic compound layer 3 is composed of the $Cu_3Sn$ layer 5 arranged on the Ni-based base layer 2 and the $Cu_6Sn_5$ layer 6 arranged on the $Cu_3Sn$ layer 5; the Cu—Sn intermetallic compound layer 3 obtained by bonding the $Cu_3Sn$ Layer 5 and the $Cu_6Sn_5$ layer 6 is provided with recessed and projected portions on the surface which is in contact with the Sn-based surface layer 4; combined thicknesses X of the recessed portions are set to 0.05 μm to 1.5 μm; the area coverage of the $Cu_3Sn$ layer 5 with respect to the Ni-based base layer 2 is 60% or higher; the ratio of the thicknesses Y of the projected portions to the thicknesses of the recessed portions in the Cu—Sn intermetallic compound layer 3 is 1.2 to 5; and the average thickness of the $Cu_1Sn$ layer 5 is 0.01 μm to 0.5 m. The Sn-based surface layer 4 is formed with a thickness of 0.05 μm to 2.5 μm. Other parts are in common with those in the first embodiment, and therefore description thereof will not be repeated.

Next, a method for producing the conductive member of the second embodiment will be described.

Firstly, as a Cu-based substrate, a plate material of Cu or a Cu alloy is prepared and subjected to degreasing, pickling, or the like to wash the surface, and then Fe plating or Fe—Ni plating, Ni plating, Cu plating, and Sn plating are sequentially performed in this order. In addition, between each plating process, a pickling or water washing process is performed.

As the conditions of the Fe plating, a sulfate bath using ferrous sulfate ($FeSO_4$) and ammonium chloride ($NH_4Cl$) as the main components is used. When performing Fe—Ni plating, a plating bath using nickel sulfate ($NiSO_4$), ferrous sulfate ($FeSO_4$), and boric acid ($H_3BO_3$) as the main components is used. The plating temperature is set to 45° C. to 55° C., and the current density is set to 5 A/dm$^2$ and 25 A/dm$^2$. Table 7 shows the conditions for the Fe plating, and Table 8 shows the conditions for the Fe—Ni plating.

TABLE 7

| Conditions of Fe plating | | |
|---|---|---|
| Composition | $FeSO_4$ | 250 g/L |
| | $NH_4Cl$ | 30 g/L |
| Condition | Temperature | 45° C. to 55° C. |
| | Current density | 5 A/dm$^2$ to 25 A/dm$^2$ |
| | Solution flow rate | 0.5 m/second or greater |
| | Anode | Iridium oxide coated titanium |

TABLE 8

| Conditions of Fe—Ni plating | | |
|---|---|---|
| Composition | $NiSO_4$ | 105 g/L |
| | $FeSO_4$ | 10 g/L |
| | $H_3BO_3$ | 45 g/L |
| Condition | Temperature | 45° C. to 55° C. |
| | Current density | 5 A/dm$^2$ to 25 A/dm$^2$ |
| | Solution flow rate | 0.5 m/second or greater |
| | Anode | Iridium oxide coated titanium |

The conditions for each of the Ni plating, the Cu plating, and the Sn plating are the same as those in the first embodiment, and thus each of the conditions in Tables 1 to 3 are applied. Plated layers of Ni or an Ni alloy are formed by electrolytically plating with a current density of 20 A/dm$^2$ and 50 A/dm$^2$; plated layers of Cu or a Cu alloy are formed by electrolytically plating with a current density of 20 A/dm$^2$ and 60 A/dm$^2$; and plated layers of Sn or an Sn alloy are formed by electrolytically plating with a current density of 10 A/dm$^2$ and 30 A/dm$^2$.

Additionally, after performing the four kinds of plating treatments, heating and a reflow treatment are performed. The reflow treatment is also the same as that in the first embodiment, and includes a heating process in which the plated layers are heated to a peak temperature of 240° C. to 300° C. at a heating rate of 20° C./second to 75° C./second after one minute to 15 minutes have elapsed after the formation of the plated layers, a primary cooling process in which the plated layers are cooled for 2 seconds to 10 seconds at a cooling rate of 30° C./second or lower after being heated to the peak temperature, and a secondary cooling process in which the plated layers are cooled at a cooling rate of 100° C./second to 250° C./second after the primary cooling process. Since the detailed method is the same as that in the first embodiment, description thereof will not be repeated.

After performing four-layer plating under the combined plating conditions shown in Tables 7 or 8, and 1 to 3 on the surface of the Cu-based substrate 1 as described above, similarly to the first embodiment, by performing the reflow treatment under the temperature profile conditions shown in FIG. 2, as shown in FIG. 7, the surface of the Cu-based substrate 1 is covered with the Fe-based base layer 31, and the Cu-based substrate 1 is covered with the $Cu_3Sn$ layer 5 is formed thereon through the Ni-based base layer 2, and the $Cu_6Sn_5$ layer 6 is further formed thereon, respectively, and the Sn-based surface layer 4 is formed on the outermost surface.

EXAMPLE 2

Next, examples of the second embodiment will be described.

Similarly to the examples in the first embodiment, as a Cu alloy plate (the Cu-based substrate), 0.25 mm-thick MAX251C (manufactured by Mitsubishi Shindoh Co., Ltd.) was used, and plating treatments of Fe, Ni, Cu, and Sn were sequentially performed on the plate. In this case, as shown in Table 6, a plurality of test specimens was prepared with varied current densities in each of the plating treatments. The target thickness of each plated layer was set to 0.5 μm for the Fe plated layer, 0.3 μm for the Ni plated layer, 0.3 μm for the Cu plated layer, and 1.5 μm for the Sn plated layer. In addition, water washing processes were inserted between each of the four kinds of plating processes to wash out plating solutions from the surfaces of treated materials.

In the plating treatment in the example, plating solutions were sprayed to the Cu alloy plate at a high speed, and an insoluble anode of a Ti plate covered with iridium oxide was used.

After performing the four kinds of plating treatments, reflow treatments were performed on the treated materials. The reflow treatments were performed 1 minute after the last Sn plating treatment and the heating process, the primary cooling process, and the secondary cooling process were performed under a variety of conditions.

The above test conditions are summarized in Table 9.

TABLE 9

| Specimens | | Plating current density ($A/dm^2$) Fe | Ni | Cu | Sn | Heating Rate (C./s) | Heating Peak temp. (C.) | Primary cooling Rate (C./s) | Primary cooling Time (s) | Secondary cooling Rate (C./s) | Fe-based base layer (m) | Ni-based base layer (m) | Cu—Sn intermetallic compound layer: $Cu_3Sn$ Avg. film thickness (m) | $Cu_3Sn$ Area coverage (%) | Thickness at recessed portions: X (m) | Thickness at projected portions: Y (m) | Recess and projection ratio Y/X | Min. film thickness of Sn-based surface layer (m) |
|---|---|---|---|---|---|---|---|---|---|---|---|---|---|---|---|---|---|---|
| Examples | 31 | 15 | 40 | 30 | 30 | 40 | 270 | 20 | 5 | 170 | 0.3 | 0.4 | 0.01 | 60 | 0.05 | 0.25 | 5 | 1.2 |
| | 32 | 15 | 40 | 40 | 20 | 40 | 270 | 20 | 5 | 170 | 0.6 | 0.3 | 0.03 | 90 | 1.5 | 1.8 | 1.2 | 0.7 |
| | 33 | 20 | 40 | 50 | 20 | 40 | 270 | 20 | 5 | 170 | 0.6 | 0.3 | 0.1 | 100 | 1.3 | 1.8 | 1.4 | 0.5 |
| | 34 | 20 | 40 | 40 | 30 | 40 | 270 | 20 | 5 | 170 | 0.5 | 0.3 | 0.4 | 90 | 0.1 | 0.5 | 5 | 1 |
| | 35 | 20 | 20 | 40 | 20 | 40 | 270 | 20 | 5 | 170 | 0.6 | 0.15 | 0.1 | 70 | 0.08 | 0.34 | 4.25 | 0.3 |
| | 36 | 20 | 50 | 40 | 10 | 40 | 270 | 20 | 5 | 170 | 0.5 | 0.4 | 0.2 | 100 | 0.4 | 1 | 2.5 | 0.05 |
| | 37 | 20 | 40 | 40 | 20 | 20 | 250 | 10 | 10 | 100 | 0.5 | 0.3 | 0.1 | 80 | 0.5 | 1 | 2 | 0.5 |
| | 38 | 20 | 40 | 40 | 20 | 40 | 240 | 20 | 3 | 150 | 0.6 | 0.3 | 0.05 | 70 | 0.2 | 0.4 | 2 | 0.6 |
| | 39 | 20 | 40 | 40 | 20 | 50 | 280 | 30 | 2 | 200 | 0.4 | 0.3 | 0.05 | 80 | 0.3 | 0.84 | 2.8 | 0.3 |
| | 40 | 5 | 40 | 40 | 20 | 50 | 280 | 20 | 5 | 200 | 0.4 | 0.2 | 0.2 | 70 | 0.3 | 1.35 | 4.5 | 0.4 |
| | 41 | 25 | 40 | 40 | 20 | 60 | 300 | 20 | 5 | 200 | 0.8 | 0.3 | 0.05 | 60 | 0.08 | 0.32 | 4 | 0.08 |
| | 42 | 20 | 40 | 40 | 20 | 75 | 300 | 20 | 5 | 250 | 0.7 | 0.3 | 0.1 | 60 | 0.06 | 0.3 | 5 | 0.5 |
| Comparative Examples | 43 | 20 | 40 | 40 | 20 | 15 | 270 | 20 | 5 | 170 | 0.7 | 0.3 | 0.03 | 40 | 0.05 | 0.1 | 2 | 1 |
| | 44 | 20 | 40 | 40 | 20 | 80 | 270 | 20 | 5 | 170 | 0.7 | 0.3 | 0.04 | 60 | 0.02 | 0.05 | 2.5 | 1 |
| | 45 | 20 | 40 | 40 | 20 | 40 | 230 | 20 | 5 | 170 | 0.6 | 0.3 | 0.2 | 70 | 0.1 | 0.6 | 6 | 0.03 |
| | 46 | 20 | 40 | 40 | 20 | 40 | 310 | 20 | 5 | 170 | 0.6 | 0.3 | 0.15 | 60 | 0.2 | 1.7 | 8.5 | 0.2 |
| | 47 | 20 | 40 | 40 | 20 | 40 | 270 | 35 | 5 | 170 | 0.6 | 0.3 | 0.05 | 70 | 0.2 | 1.48 | 7.4 | 0.1 |
| | 48 | 20 | 40 | 40 | 20 | 40 | 270 | 20 | 1 | 170 | 0.6 | 0.3 | 0.03 | 60 | 0.08 | 0.45 | 5.63 | 0.15 |
| | 49 | 20 | 40 | 40 | 20 | 40 | 270 | 20 | 11 | 170 | 0.5 | 0.3 | 0.01 | 40 | 0.5 | 2.25 | 4.5 | 0.05 |
| | 50 | 20 | 40 | 40 | 20 | 40 | 270 | 20 | 5 | 95 | 0.6 | 0.3 | 0.04 | 50 | 0.08 | 0.28 | 3.5 | 0.05 |
| | 51 | 20 | 40 | 40 | 20 | 40 | 270 | 20 | 5 | 260 | 0.7 | 0.3 | 0.05 | 60 | 0.5 | 4.3 | 8.6 | 0.05 |
| | 52 | 2 | 40 | 40 | 20 | 40 | 270 | 20 | 5 | 170 | 0.08 | 0.2 | 0.4 | 60 | 0.05 | 0.5 | 10 | 1.2 |
| | 53 | 30 | 40 | 40 | 20 | 40 | 270 | 20 | 5 | 170 | 1.3 | 0.3 | 0.05 | 70 | 1.1 | 1.3 | 1.2 | 0.1 |
| | 54 | 20 | 15 | 40 | 20 | 40 | 270 | 20 | 5 | 170 | 0.6 | 0.1 | 0.04 | 60 | 0.05 | 0.38 | 7.6 | 0.05 |
| | 55 | 20 | 60 | 40 | 10 | 40 | 270 | 20 | 5 | 170 | 0.7 | 0.5 | 0.05 | 60 | 0.2 | 1.3 | 6.5 | 0.1 |
| | 56 | 20 | 40 | 15 | 15 | 40 | 270 | 20 | 5 | 170 | 0.7 | 0.3 | <0.01 | 50 | 0.03 | 0.15 | 5 | 0.03 |
| | 57 | 20 | 30 | 65 | 20 | 40 | 270 | 20 | 5 | 170 | 0.8 | 0.2 | 0.3 | 70 | 1.8 | 5.4 | 3 | 0.04 |
| | 58 | 20 | 40 | 40 | 5 | 40 | 270 | 20 | 5 | 170 | 0.7 | 0.3 | 0.05 | 60 | 1.6 | 10.4 | 6.5 | 0.03 |
| | 59 | 20 | 30 | 30 | 40 | 40 | 270 | 20 | 5 | 170 | 0.7 | 0.2 | 0.6 | 70 | 1 | 3.6 | 3.6 | 0.02 |
| | 60 | 20 | 10 | 10 | 5 | 40 | 270 | 20 | 5 | 170 | 0.8 | 0.1 | 0.05 | 50 | 0.05 | 0.41 | 8.2 | 0.05 |
| | 61 | 2 | 2 | 2 | 2 | 40 | 270 | 20 | 5 | 170 | 0.05 | 0.05 | <0.01 | 40 | 0.02 | 0.1 | 5 | 1.5 |

From the results of an energy dispersion type X-ray spectroscopic analysis using a transmission electron microscope (TEM-EDS analysis), the cross-sections of the treated materials in the example were composed of a five-layer structure of the Cu-based substrate, the Fe-based base layer, the Ni-based thin film layer, the $Cu_3Sn$ layer, the $Cu_6Sn_5$ layer, and the Sn-based surface layer, in which recessed and projected portions were present on the surface of the $Cu_6Sn_5$ layer, and the thicknesses of the recessed portions were 0.05 µm or greater. In addition, a discontinuous $Cu_3Sn$ layer was present in the interface between the $Cu_6Sn_5$ layer and the Ni-based thin film layer, and the surface coverage of the $Cu_3Sn$ layer with respect to the Ni-based thin film layer, which was observed with scanning ion microscope of the cross-sections by focused ion beam (FIB-SIM images), was 60% or higher.

With respect to specimens prepared with the conditions shown in Table 9, the contact resistances, presence of separation, abrasion resistance, and corrosion resistance after 175° C.×1000 hours had elapsed were measured. In addition, the coefficients of kinetic friction were also measured.

The contact resistances were measured using an electric contact resistance tester (manufactured by Yamazaki Seiki Co., Ltd.) under conditions of a sliding load of 0.49 N (50 gf) after leaving the specimens idle for 175° C.×1000 hours.

As the separation tests, after performing 90° bending (radius of curvature R: 0.7 mm) with a load of 9.8 kN, the specimens were retained in the atmosphere for 160° C.×250 hours and bent back, and then the separation states at the bent portions were confirmed.

With regard to the abrasion resistance, according to the reciprocating abrasion test defined by JIS H 8503, a test load of 9.8 N and abrasive paper No. 400 were used, and the number of reciprocating motions until the base material (the Cu-based substrate) was exposed was measured. ○ was given to test specimens with plating left even after testing 50 times, and x was given to test specimens whose base material had been exposed within testing 50 times.

With regard to the corrosion resistance, the neutral salt water spraying test defined by JIS H 8502 was performed for 24 hours, and ○ was given to test specimens with no observed occurrence of red rust, and x was give to test specimens with an observed occurrence of red rust.

With regard to the coefficients of kinetic friction, plate-like male specimens and semispherical female specimens with an internal diameter of 1.5 mm were prepared with the respective test specimens so as to simulate the contact portions between the male terminals and the female terminals of an engagement type connector, and then friction forces between both specimens were measured using a horizontal load measuring apparatus (Model-2152NRE, manufactured by Aikoh Engineering Co., Ltd.), thereby obtaining the coefficients of kinetic friction. A specific method is the same as that of the above example, and, as shown in FIG. 5, a male specimen 22 is fixed on a horizontal table 21, and the semispherical projected surface of a female specimen 23 is placed thereon so that the plated surfaces come into contact with each other, and a load P of 4.9 N (500 gf) is applied to the female specimen 23 through a weight 24, thereby forming a state in which the male specimen 22 is pressed. In a state in which the load P is applied, a friction force F when the male specimen 22 is extended by 10 mm in a horizontal direction shown by an arrow at a sliding rate of 80 mm/minute was measured through a load cell 25. The coefficients of kinetic friction ($=F_{av}/P$) was obtained from the average value $F_{av}$ of the friction forces F and the load P.

The results are shown in Table 10.

TABLE 10

| Test Specimens | | High temperature environment evaluation test: Contact resistance (mΩ) | High temperature environment evaluation test: Presence of separation | Abrasion resistance | Corrosion resistance | Coefficent of kinetic friction |
|---|---|---|---|---|---|---|
| Examples | 31 | 5.2 | ○ | ○ | ○ | 0.22 |
| | 32 | 2.5 | ○ | ○ | ○ | 0.32 |
| | 33 | 3 | ○ | ○ | ○ | 0.35 |
| | 34 | 2.5 | ○ | ○ | ○ | 0.21 |
| | 35 | 6.1 | ○ | ○ | ○ | 0.38 |
| | 36 | 2.6 | ○ | ○ | ○ | 0.22 |
| | 37 | 3 | ○ | ○ | ○ | 0.23 |
| | 38 | 2.8 | ○ | ○ | ○ | 0.21 |
| | 39 | 2 | ○ | ○ | ○ | 0.36 |
| | 40 | 2.5 | ○ | ○ | ○ | 0.33 |
| | 41 | 4 | ○ | ○ | ○ | 0.38 |
| | 42 | 3 | ○ | ○ | ○ | 0.38 |
| Comparative Examples | 43 | 7.7 | ○ | ○ | X | 0.42 |
| | 44 | 7.3 | ○ | X | ○ | 0.41 |
| | 45 | 7.1 | X | X | X | 0.44 |
| | 46 | 6.3 | ○ | X | ○ | 0.54 |
| | 47 | 5.2 | ○ | X | ○ | 0.51 |
| | 48 | 5.1 | ○ | X | ○ | 0.51 |
| | 49 | 3 | X | ○ | X | 0.35 |
| | 50 | 7.2 | ○ | X | X | 0.39 |
| | 51 | 5.6 | X | X | X | 0.58 |
| | 52 | 10.6 | X | X | ○ | 0.55 |
| | 53 | 5.2 | X | ○ | ○ | 0.36 |
| | 54 | 4.5 | ○ | X | X | 0.52 |
| | 55 | 7.2 | X | X | X | 0.55 |
| | 56 | 10.5 | ○ | X | X | 0.48 |
| | 57 | 5.4 | X | X | X | 0.36 |
| | 58 | 8.5 | X | X | X | 0.58 |
| | 59 | 10.8 | ○ | ○ | X | 0.32 |
| | 60 | 7.8 | X | X | X | 0.53 |
| | 61 | 12.1 | X | X | ○ | 0.35 |

As is clear from Table 10, in the conductive member of the example, since the contact resistance at high temperatures is small, there is no occurrence of separation, and the abrasion resistance and solderability were excellent. In addition, the coefficient of kinetic friction is also small, and therefore it can be determined that the inserting and drawing force when used for a connector is also small, which is favorable.

In addition, with regard to the contact resistances, change over time during heating of 175° C.×1000 hours was measured using test specimens No. 36 and 61, and, similarly to the relationship between the examples and the comparative examples shown in the above-described FIG. 6, while test specimen No. 36 of the invention showed a small increase in the contact resistance even when exposed to a high temperature over an extended period, test specimen No. 61 of the related art showed an increase in the contact resistance of 10 mΩ or more when 1000 hours had elapsed. While test specimen No. 6 of the invention formed a five-layer structure with the Sn-based surface layer left by the heat resistance of the Fe-based base layer, in test specimen No. 31 of the related art, since the Fe-based base layer was thin so that the Fe-based base layer could not sufficiently function as a barrier layer, Cu oxides covered the surface, which was considered as a cause of the increase in the contact resistance.

In addition, plating separation property due to the idle times after the plating treatment until the reflow treatment was tested. Similarly to the above, for the separation tests, after 90° bending (radius of curvature R: 0.7 mm) with a load of 9.8 kN was performed on the specimens, the specimens were retained in the atmosphere at 160° C.×250 hours and bent back, and then the separation states at the bent portions were confirmed. The results are shown in Table 11.

TABLE 11

| Idle time between plating and reflow treatment | Plating current density (A/$dm^2$): Fe | Ni | Cu | Sn | Evaluation Presence of separation |
|---|---|---|---|---|---|
| 1 minute | 20 | 40 | 40 | 20 | ○ |
| 5 minutes | 20 | 40 | 40 | 20 | ○ |
| 15 minutes | 20 | 40 | 40 | 20 | ○ |
| 30 minutes | 20 | 40 | 40 | 20 | X |
| 60 minutes | 20 | 40 | 40 | 20 | X |

As can be seen from Table 11, as the idle time after plating becomes longer, separation occurs. This is considered because a long idle time causes Cu crystal grains precipitated at a high current density to enlarge and also, naturally, Cu and Sn react generating $Cu_6Sn_5$ so as to hinder the smooth alloying of $Cu_6Sn_5$ and $Cu_3Sn$ during the reflow.

The results of the above studies show that provision of the Fe-based base layer improves the heat resistance, and, due to the ductility of Fe, it is possible to prevent generation of plating separation or cracks during a bending process. Furthermore, since the Fe-based base layer with high hardness and high toughness is included, abrasion resistance is good, and it is possible to prevent the sliding abrasion when used for a connector terminal. Furthermore, the solderability is also improved, and soldering becomes easier than conductive members formed by the three-layer plating in the related art. In addition, the $Cu_6Sn_5$ layer and the $Cu_3Sn$ layer have an effect of preventing the reaction of the Ni-based thin film layer and the Sn-based surface layer, and, among them, the $Cu_3Sn$ alloy layer is greater in terms of the effect. In addition, it was found that, since Sn atoms diffuse from the recessed portions in the $Cu_6Sn_5$ layer to Ni so as to make Sn and Ni react, the $Cu_6Sn_5$ layer has a relatively small number of recessed and projected portions, and the $Cu_3Sn$ layer covers more of the surface of the Ni-based thin film layer, and therefore it is possible to prevent degradation of the contact resistance during heating, and also to prevent occurrence of separation, and, furthermore, to reduce the inserting and drawing force when used for a connector.

Meanwhile, it is found from the above-described TEM-EDS analysis that 0.76% by weight to 5.32% by weight of Ni is mixed in the $Cu_6Sn_5$ layer, and therefore a small amount of Ni is mixed in the Cu—Sn intermetallic compound layer according to the invention.

REFERENCE SIGNS LIST

1 Cu-BASED SUBSTRATE
2 Ni-BASED BASE LAYER
3 Cu—Sn INTERMETALLIC COMPOUND LAYER
4 Sn-BASED SURFACE LAYER
5 $Cu_3Sn$ LAYER
6 $Cu_6Sn_5$ LAYER
7 RECESSED PORTION
8 PROJECTED PORTION
10 CONDUCTIVE MEMBER
30 CONDUCTIVE MEMBER
31 Fe-BASED BASE LAYER

The invention claimed is:

1. A method for producing a conductive member comprising:

plating Ni or an Ni alloy, Cu or a Cu alloy, and Sn or an Sn alloy in this order on the surface of a Cu-based substrate so as to form a plated layer respectively, and then performing heating and a reflow treatment on the plated layers so as to sequentially form an Ni-based base layer, a Cu—Sn intermetallic compound layer, and an Sn-based surface layer on the Cu-based substrate, wherein the Cu—Sn intermetallic compound layer is composed of a $Cu_3Sn$ layer arranged on the Ni-based base layer and a $Cu_6Sn_5$ layer arranged on the $Cu_3Sn$ layer;

the Cu—Sn intermetallic compound layer obtained by bonding the $Cu_3Sn$ layer and the $Cu_6Sn_5$ layer is provided with recessed and projected portions on the surface which is in contact with the Sn-based surface layer; and the thicknesses of the recessed portions are set to 0.05 μm to 1.5 μm, the area coverage of the Cu3Sn layer with respect to the Ni-based base layer is 60% or higher, the ratio of the thicknesses of the projected portions to the thicknesses of the recessed portions in the Cu—Sn intermetallic compound layer is 1.2 to 5, and the average thickness of the Cu3Sn layer is 0.01 μm to 0.5 μm, and wherein the plated layer of the Ni or Ni alloy is formed by electrolytically plating with a current density of 20 $A/dm^2$ to 50 $A/dm^2$; and the plated layer of the Cu or Cu alloy is formed by electrolytically plating with a current density of 20 $A/dm^2$ to 60 $A/dm^2$; the plated layer of the Sn or Sn alloy is formed by electrolytically plating with a current density of 10 $A/dm^2$ to 30 $A/dm^2$; and the reflow treatment includes a heating process in which the plated layers are heated to a peak temperature of 240° C. to 300° C. at a heating rate of 20 to 75° C./second after 1 to 15 minutes has elapsed from the formation of the plated layers; a primary cooling process in which the plated layers are cooled for 2 seconds to 10 seconds at a cooling rate of 30° C./second or lower after being heated to the peak temperature; and a secondary cooling process in which the plated layers are cooled at a cooling rate of 100° C./second to 250° C./second after the primary cooling process.

2. A method for producing a conductive member comprising:

plating Fe or an Fe alloy, Ni or an Ni alloy, Cu or a Cu alloy, and Sn or an Sn alloy in this order on the surface of a Cu-based substrate so as to form a plated layer respectively, and then performing heating and a reflow treatment on the plated layers so as to sequentially form an Fe-based base layer, an Ni-based base layer, a Cu—Sn intermetallic compound layer, and an Sn-based surface layer on the Cu-based substrate, wherein the Cu—Sn intermetallic compound layer is composed of a $Cu_3Sn$ layer arranged on the Ni-based base layer and a $Cu_6Sn_5$ layer arranged on the $Cu_3Sn$ layer;

the Cu—Sn intermetallic compound layer obtained by bonding the $Cu_3Sn$ layer and the $Cu_6Sn_6$ layer is provided with recessed and projected portions on the surface which is in contact with the Sn-based surface layer; and the thicknesses of the recessed portions are set to 0.05 μm to 1.5 μm, the area coverage of the Cu3Sn layer with respect to the Ni-based base layer is 60% or higher, the ratio of the thicknesses of the projected portions to the thicknesses of the recessed portions in the Cu—Sn intermetallic compound layer is 1.2 to 5, and the average thickness of the Cu3Sn layer is 0.01 μm to 0.5 μm, and wherein the plated layer of the Fe or the Fe alloy is formed by electrolytically plating with a current density of 5 $A/dm^2$ to 25 $A/dm^2$;

the plated layer of the Ni or the Ni alloy is formed by electrolytically plating with a current density of 20 $A/dm^2$ to 50 $A/dm^2$;

the plated layer of the Cu or the Cu alloy is formed by electrolytically plating with a current density of 20 $A/dm^2$ to 60 $A/dm^2$; the plated layer of the Sn or the Sn alloy is formed by electrolytically plating with a current density of 10 $A/dm^2$ to 30 $A/dm^2$; and the reflow treatment includes a heating process in which the plated layers are heated to a peak temperature of 240° C. to 300° C. at a heating rate of 20° C./second to 75° C./second after 1 minute to 15 minutes has elapsed from the formation of the plated layers; a primary cooling process in which the plated layers are cooled for 2 seconds to 10 seconds at a cooling rate of 30° C./second or lower after being heated to the peak temperature; and a secondary cooling process in which the plated layers are cooled at a cooling rate of 100° C./second to 250° C./second after the primary cooling process.

3. A conductive member produced by the method for producing a conductive member according to claim 1.

4. A conductive member produced by the method for producing a conductive member according to claim 2.

* * * * *